United States Patent [19]

Randolph et al.

[11] Patent Number: 5,139,642
[45] Date of Patent: Aug. 18, 1992

[54] PROCESS FOR PREPARING A NONCONDUCTIVE SUBSTRATE FOR ELECTROPLATING

[75] Inventors: Catherine M. Randolph, Hamden, Conn.; Barry F. Nelsen, Mountain Lake, N.J.

[73] Assignee: Olin Corporation, Cheshire, Conn.

[21] Appl. No.: 747,066

[22] Filed: Aug. 19, 1991

Related U.S. Application Data

[63] Continuation-in-part of Ser. No. 694,517, May 1, 1991.

[51] Int. Cl.$^5$ .................... C25D 5/02; C25D 5/54
[52] U.S. Cl. ........................ 205/125; 205/166
[58] Field of Search ............... 205/125, 166; 252/510

[56] References Cited

U.S. PATENT DOCUMENTS

| | | | |
|---|---|---|---|
| 409,096 | 8/1989 | Blank | 204/29 |
| 1,037,469 | 9/1912 | Goldberg | 427/123 |
| 1,352,331 | 9/1920 | Unno | 204/31 |
| 2,243,429 | 5/1941 | Laux | 204/30 |
| 3,099,608 | 7/1963 | Radovsky et al. | 204/15 |
| 3,163,588 | 12/1964 | Shortt et al. | 204/15 |
| 4,035,265 | 7/1977 | Saunders | 252/510 |
| 4,090,984 | 5/1978 | Lin et al. | 252/511 |
| 4,239,794 | 12/1980 | Allard | 428/219 |
| 4,581,301 | 4/1986 | Michaelson | 428/551 |
| 4,619,714 | 10/1986 | Minten et al. | 204/15 |
| 4,622,107 | 11/1986 | Piano | 204/15 |
| 4,622,108 | 11/1986 | Polakovic et al. | 204/15 |
| 4,631,117 | 12/1986 | Minten et al. | 204/15 |
| 4,684,560 | 8/1987 | Minten et al. | 428/131 |
| 4,718,993 | 1/1988 | Cupta et al. | 204/15 |
| 4,724,005 | 2/1988 | Minten et al. | 106/307 |
| 4,874,477 | 10/1989 | Pendleton | 204/15 |
| 4,897,164 | 1/1990 | Piano et al. | 204/15 |
| 4,964,959 | 10/1990 | Nelsen et al. | 204/15 |
| 4,994,153 | 2/1991 | Piano et al. | 204/15 |
| 5,015,339 | 6/1991 | Pendleton | 204/15 |

Primary Examiner—T. M. Tufariello
Attorney, Agent, or Firm—William A. Simons

[57] ABSTRACT

Described herein is an improved process for electroplating a conductive metal layer to the surface of a nonconductive material comprising pretreating the material with a carbon black dispersion followed by a graphite dispersion before the electroplating step.

30 Claims, No Drawings

PROCESS FOR PREPARING A NONCONDUCTIVE SUBSTRATE FOR ELECTROPLATING

CROSS-REFERENCE TO RELATED APPLICATION

This application is a continuation-in-part application of U.S. patent application Ser. No. 07/694,517, filed on May 1, 1991, with Catherine Mailhe Randolph and Barry F. Nelsen as the named inventors.

BACKGROUND OF THE INVENTION

Field of the Invention

This invention is directed to an improved process for electroplating a conductive metal to the surface of a nonconductive material. In particular, this invention relates to a process for preparing the through hole walls of a printed wiring board (PWB) for electroplating. Further, this invention relates to a new liquid conductive graphite dispersion for preparing nonconductive material for electroplating. Still further, the present invention relates to the resulting nonconductive material prepared by the above-noted process.

Conventional electroless processes have several commercial disadvantages. They require a relatively long process time. The multiple treatment baths have complex chemistry which may require constant monitoring and individual ingredients which may require separate replenishment. The conventionally used palladium/tin activator also may require expensive waste treatment. Furthermore, these electroless process baths may be very sensitive to contamination. Finally, the multiplicity of rinse baths may require large amounts of water.

Prior to the electroless method of plating through holes, graphite was employed to prepare the walls of the through holes for plating. For example, U.S. Pat. No. 3,099,608, which issued to Radovsky et al. on Jul. 30, 1963, teaches a process for preparing the through hole walls of printed circuit boards (also called printed wiring boards or PWB's) for electroplating by initially depositing in said through holes a thin electrically nonconductive film of palladium metal in at least a semi-colloidal form. The patent discloses that graphite had been used previously as a conductive layer for electroplating thereon. See column 1, lines 63-70 and column 4, line 72 to column 5, line 11. These patentees noted several deficiencies with that graphite process including lack of control of the graphite application, poor deposit of the resultant electroplated metal, nonuniform through hole diameters, and low electrical resistance of the graphite.

U.S. Pat. No. 3,163,588, which issued to Shortt et al. on Dec. 29, 1964, also mentions that graphite or its equivalents may be employed to render through hole walls of electric circuit boards conductive for later electroplating metals thereon. See column 3, line 45 to column 4, line 2.

U.S. Pat. No. 4,581,301, which issued to Michaelson on Apr. 8, 1986, teaches the application of a seed layer of conductive particles, such as "carbon", on the walls of through holes before electrolytically plating copper over the seed layer. This reference does not explicitly teach the use of a continuous layer of carbon black dispersion in the seed layer, and does not recognize the advantage of using very small particles of carbon black such as presently claimed. See column 7, lines 63-66 which refer to particles passing through a 400 mesh screen. A 400 mesh screen is equivalent to about 35 microns.

Separately, graphite has been employed in numerous processes for preparing a nonconducting material for a metal coating or plating For example, U.S. Pat. No. 409,096, which issued to Alois Blank on Aug. 13, 1889, teaches a process for applying copper to asbestos roofing material which comprises first applying powdered plumbago (graphite) in a volatile liquid such as varnish to the surface of the asbestos, then evaporating the volatile liquid to coat the asbestos fibers with fine particles of plumbago. The plumbago coated asbestos sheets are then immersed in a copper electroplating solution and electric current is applied to the coated asbestos sheet to form a thin film of copper thereon. The copper coated sheet is then immersed in a bath of molten metal such as tin, lead, or zinc, and is then removed from the molten bath to effect solidification of the molten metal. The resulting metal coated asbestos sheet is described as being relatively flexible, a nonconductor of heat and substantially fireproof.

U.S. Pat. No. 1,037,469, which issued to Goldberg on Sep. 3, 1912, and U.S. Pat. No. 1,352,331, which issued to Unno on Sep. 7, 1920, disclose processes for electroplating nonconducting materials by first coating the nonconducting material with wax, then coating the wax with a slurry of finely divided particles of graphite or other metal, followed by electroplating of the dust-coated surface with copper or other metal. Neither of these processes are particularly suitable for use in coating the hole walls of circuit boards because the holes are normally extremely narrow in diameter and immersing in wax would tend to plug the hole and prevent coating the hole walls with an electroplating material.

U.S. Pat. No. 2,243,429, which issued to Laux on May 27, 1941, discloses a process for electroplating a nonconductive surface by "graphiting" a thin layer onto the nonconducting surface followed by applying a copper layer electrolytically and "finally a further electrolytic deposit of another metal" is placed thereon.

Separately, carbon black formulations have been employed as conductive coatings for nonconductive materials. For example, U.S. Pat. No. 4,035,265, which issued to Saunders on Jul. 12, 1977, discloses conductive paint compositions containing both graphite and carbon black along with air-hardenable binder. These paints are suitable for application to the walls of a building for use as a heating element.

U.S. Pat. No. 4,090,984, which issued to Lin et al. on May 23, 1978, teaches a semiconductive coating for glass fibers comprising (a) a polyacrylate emulsion; (b) electrically conductive carbon black dispersion and (c) a thixotropic gelling agent. The conductive carbon black dispersions employed are those comprising electrically conductive carbon black dispersed, from about 3 to about 4% by weight, in a suitable dispersing agent.

U.S. Pat. No. 4,239,794, which issued to Allard on Dec. 16, 1980, teaches dispersing a conductive carbon black in a latex binder with a selected dispersing agent, then impregnating this carbon black dispersion into a nonwoven fibrous web followed by drying any residual water, leaving a thin coating of carbon black dispersed on the surfaces of said fibers.

U.S. Pat. No. 4,619,714, which issued Oct. 28, 1986, and its divisional, U.S. Pat. Nos. 4,684,560, which issued Aug. 4, 1987 and 4,724,005, which issued Feb. 9, 1988, describe a process for electroplating a conductive metal to the surface of a nonconductive material, particularly a process of electroplating the through holes of a printed wiring board. This process is a significant improvement over the known electroless techniques. By this process, a liquid dispersion of carbon black particles is first applied to the nonconductive material, such as the nonconductive portions of through holes on a printed wire board; then the liquid dispersion medium is separated (i.e., evaporated) from the carbon black particles, thereby depositing a substantially continuous layer of carbon black particles on the nonconductive surface; and next a substantially continuous metal layer is electroplated over the deposited carbon black layer. This process of U.S. Pat. No. 4,619,714 has several advantages over the known electroless techniques including the elimination of the preactivator, the Pd/Sn activator, and the accelerator; less possibility of pollution problems; better bath stability; and fewer possible side reactions.

In Comparisons 1 and 2, in columns 19 and 20 of U.S. Pat. No. 4,619,714, two formulations containing graphite were prepared and circuit boards were treated with the formulations. These graphite formulations employed relatively large size graphite particles. The mean particle size of the solids in these Comparisons was found to be 3.1 microns. The circuit board was then plated. The patent states in column 20, lines 16-20, that in all, both graphite formulations were far inferior for copper electroplating preparation as compared to formulations containing carbon black. The reason why these Comparisons failed may be attributed in part to the relative large size of the graphite particles in that dispersion.

Improvements and modifications of the electroplating process of U.S. Pat. Nos. 4,619,741, 4,684,560, and 4,724,005 are described in the following patents:

U.S. Pat. No. 4,622,107, which issued Nov. 11, 1986, describes the use of a gas-forming compound (e.g., sodium carbonate) to remove loosely or easily removable carbon black particles in the through holes.

U.S. Pat. No. 4,622,108, which issued Nov. 11, 1986, describes the contacting of an alkaline hydroxide preconditioning solution to the through-hole walls before application of the carbon black dispersion so that the carbon black dispersion will have better adhesion to the walls.

U.S. Pat. No. 4,631,117, which issued Dec. 23, 1986, describes the use of the carbon black dispersion described in U.S. Pat. No. 4,619,714 as a preactivator for electroless plating of the through holes.

U.S. Pat. No. 4,718,993, which issued Jan. 12, 1988, describes the use of an aqueous alkaline silicate solution to contact a printed wiring board prior to contacting with the carbon black dispersion.

U.S. Pat. No. 4,874,477, which issued Oct. 7, 1989, describes contacting a printed wire board with a particular aqueous polyelectrolyte homopolymer conditioner followed by contacting the printed wiring board with the carbon black dispersion.

U.S. Pat. No. 4,897,164, which issued Jan. 30, 1990, describes contacting a printed wiring board with an aqueous solution of an alkali metal borate after it has been contacted with the carbon black dispersion and prior to microetching.

U.S. Pat. No. 4,964,959, which issued Oct. 23, 1990, describes the addition of a conductive polymer or combinations thereof to the carbon back dispersion.

U.S. Pat. No. 4,994,153, which issued Feb. 19, 1991, describes a process for treating the tooling holes or slots which have been coated with a carbon black dispersion in a nonconductive material which comprises removing said carbon black with an aqueous solution containing: (a) an alkanolamine; (b) an anionic surfactant which is the neutralized addition product of maleic and/or fumaric acid and a poly(oxylated) alcohol; (c) a nonionic surfactant which is an aliphatic mono and/or diphosphate ester; and (d) an alkali or alkaline earth metal hydroxide.

U.S. Pat. No. 5,015,339, which issued on May 14, 1991, describes an electroplating pretreatment wherein nonconductive material is first contacted with an alkaline permanganate solution, then a neutralizer/conditioner solution and then a carbon black dispersion.

All of the above-noted U.S. patents are incorporated herein by reference in their entireties.

While the above patents describe an effective means for electroplating a metal to the surface of a nonconductive material, particularly the through holes of a printed wiring board (PWB), there is still a desire to improve the overall quality of that electroplating process.

One of the limiting factors in the above-noted carbon black dispersion preplating process, described generally in U.S. Pat. Nos. 4,619,714; 4,684,560; and 4,724,005 and their above-noted improvement patents, is the plating speed of copper over the carbon black deposit, or in other words, the time needed to achieve complete coverage of the through holes by electrodeposited copper. Currently, the copper plating speed in PWB through holes is restricted by the relatively high resistance of the carbon black films. It has now been found that the deposition of a conductive graphite layer on top of the carbon black layer enhances the overall conductivity of the carbon black coating and, therefore, yields faster plating rates. Some of the patents mentioned above have described the use of graphite. However, such graphite films are usually plagued by adhesion problems. In the process of the present invention, fine particle-size conductive graphite is deposited on top of a carbon black deposit. The carbon black deposit serves as an adhesion promoter for the graphite film. The conductivity and particle size of graphite particles are critical parameters of the present invention.

BRIEF SUMMARY OF THE INVENTION

Accordingly, the present invention is directed to a process of electroplating a conductive metal layer to the surface of a nonconductive material comprising the steps of:

(a) contacting said nonconductive material surface with a liquid carbon black dispersion comprising:
  (1) carbon black particles having an average particle diameter of less than about 3.0 microns in said dispersion;
  (2) an effective dispersing amount of a surfactant which is compatible with said carbon black; and
  (3) a first liquid dispersing medium, wherein the amount of carbon black is sufficient to coat substantially all of said nonconducting surfaces and is less than about 4% by weight of said liquid carbon black dispersion;

(b) separating substantially all of said first liquid dispersing medium from said carbon black particles, whereby said particles are deposited on said nonconductive surface in a substantially continuous layer;

(c) contacting said carbon black coated nonconductive surfaces with a liquid conductive graphite dispersion comprising:

(1) conductive graphite particles having an average particle diameter of less than about 1.5 microns in said dispersion;

(2) an effective dispersing amount of a surfactant which is compatible with said conductive graphite; and (3) a second liquid dispersing medium wherein the amount of conductive graphite is less than about 4% by weight of said liquid conductive graphite dispersion;

(d) separating substantially all of said second liquid dispersing medium from said graphite particles, whereby said particles are deposited on said nonconductive surface; and (e) electroplating a substantially continuous conductive metal layer over the deposited carbon black layer and the deposited conductive graphite layer and said nonconductive surface.

The process of this invention is particularly useful for applying a conductive metal layer such as a copper layer to the nonconducting portions of through hole walls of printed wiring boards. These printed wiring boards are usually composed of a nonconductive layer (e.g., epoxy resin/glass fiber mixture) positioned between two conductive metal layers (e.g., copper or nickel plates or foils) or a multiplicity of said alternating layers. Applying a conducting metal layer over said nonconducting portions of said through hole walls electrically connects the conductive metal layers. However, the process of this invention is effective for electroplating a conductive metal onto the surface of a nonconducting material of virtually any shape or surface area.

Further, the present invention also encompasses the resulting printed nonconductive materials prepared by the above-noted process (i.e., those having their through hole walls coated with the carbon black deposit, the graphite deposit, and the metal plating thereover).

Still further, the present invention encompasses certain liquid dispersions of fine-sized conductive graphite particles.

DESCRIPTION OF PREFERRED EMBODIMENTS

As previously stated, one preferred embodiment of the present invention is preparing the through hole walls of a printed wiring board for the application of an electroplated layer of copper over a nonconducting layer separating two plates or foils of copper. This preparation process entails placing a selected liquid carbon black dispersion followed by placing a selected liquid conductive graphite dispersion over the non-conducting portions of the through hole walls before electroplating.

Printed wiring boards (also known as printed circuit boards or PWB's) are generally laminated materials comprised of two or more plates or foils of copper, which are separated from each other by a layer of nonconducting material. Although copper is generally used as the electroplating metal in printed wiring boards, those skilled in the art will recognize that other metals such as nickel, gold, palladium, silver and the like can also be electroplated by the process of this invention. The nonconducting layer or layers are preferably an organic material such as an epoxy resin impregnated with glass fibers. However, the nonconducting layer may also be comprised of thermosetting resins, thermoplastic resins, and mixtures thereof, with or without reinforcing materials such as fiberglass and fillers.

Suitable thermoplastic resins include the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrilestyrene copolymers and acrylonitrile-butadiene-styrene (ABS) copolymers; polycarbonates; polychlorotrifluoroethylene; and vinyl polymers and copolymers, such as vinyl acetate, vinyl alcohol, vinyl butyral, vinyl chloride, vinyl chloride-acetate copolymer, vinylidene chloride, vinyl formal, Teflon; and the like.

Suitable thermosetting resins include alkyl phthalate, furane; melamine-formaldehyde; phenol formaldehyde and phenol-furfural copolymers; alone or compounded with butadiene acrylonitrile copolymer or acrylonitrile-butadiene-styrene (ABS) copolymers; polyacrylic esters; silicones; urea formaldehydes; epoxy resins; polyimides; alkyl resins; glyceryl phthalates; polyesters; and the like.

In many printed wiring board designs, the electrical pathway or pattern requires a connection between the separated copper plates at certain points in the pattern. This is usually accomplished by drilling holes at the desired locations through the laminate of copper plates and the nonconducting layer and then connecting the separate metal plates. The hole diameters of printed wiring boards generally range from between about 0.5 and about 10 millimeters in diameter, and preferably from about 1 to about 5 millimeters.

After drilling these through holes, it may be desirable to deburr the holes to make the hole walls relatively smooth. In the case of multilayer printed wiring boards, it may also be desirable to subject the boards to a desmear or etchback operations to clean the inner copper interfacing surfaces of the through holes. Suitable preparative operations include any or all of the presently available conventional operations including conventional permanganate desmearing processes.

Once the surfaces of through holes have been made relatively smooth for plating, it is preferred to subject the PWB to a precleaning process in order to place the printed wiring board in condition for receiving the liquid carbon black dispersion. In one preferred precleaning operation, the printed wiring board is first placed in a cleaner bath for about 1 to 10 minutes at a temperature of about 45° C. to about 70° C. to remove grease and other impurities from the hole wall surfaces. In this embodiment, one preferred cleaner is comprised of monoethanolamine, SANDOLEC CF cationic polyelectrolyte and ethylene glycol in water, which is available as "BLACKHOLE ® Cleaner 2" from the Olin Hunt Specialty Products, Inc. of West Paterson, NJ. Other suitable cleaners from Olin Hunt Specialty Products, Inc. include 1100 Series Cleaner (also an aqueous solution of monoethanolamine, SANDOLEC CF cationic polyelectrolyte and ethylene glycol), and 1200 Series Cleaner 2 (an aqueous solution containing monoethanolamine, NEODOL 91-8 nonionic surfactant, and ethylene glycol).

After the application of the cleaner, the PWB is subsequently rinsed in water to remove excess cleaner from the board and then contacted with a conditioner solution. The preferred method of contacting with a conditioner is dipping the cleaned PWB into a room temperature aqueous conditioner bath for about 1-10 minutes. This conditioner solution is used to ensure that substantially all of the hole wall glass/epoxy surfaces are properly prepared to accept a continuous layer of the subsequent carbon black particles. Such conditioner solutions have been customarily used in electroless processing to precondition the boards for the electroless chemistry. See U.S. Pat. No. 4,634,691, which issued to Lindsey on Jan. 6, 1987, for a discussion of conditioner solution. The Lindsey patent is incorporated herein by reference in its entirety. One preferred conditioner is "BLACK-HOLE Conditioner" available from Olin Hunt Specialty Products, Inc. of West Paterson, NJ. This conditioner formulation comprises the mixture of monoethanolamine and SANDOLEC CF cationic polyelectrolyte. The preferred concentration of total conditioner ingredients in water is from about 1% to about 10% by weight. Other preferred conditioners available from Olin Hunt Specialty Products, Inc. include the 1105 Conditioner (also an aqueous solution of monoethanolamine and SANDOLEC CF cationic polyelectrolyte) and 1205 Conditioner (an aqueous solution of monoethanolamine and ETADURIN F cationic polyamine polymer available from Akzo Chemical Company of Chicago, IL).

Other conditioners include cationic polyacrylamide polyelectrolytes such as MAGNIFLOC cationic resins available from American Cyanimid Company of Wayne, NJ.

The liquid carbon black dispersion is next applied to or contacted with the conditioned PWB. This dispersion contains three critical ingredients, namely, carbon black, one or more surfactants capable of dispersing the carbon black and a liquid dispersing medium such as water. The preferred methods of contacting the dispersion to the PWB include immersion, spraying or other methods of contacting chemicals used in the PWB industry. A single working bath is sufficient for applying this carbon black dispersion; however, more than one bath may be used for rework or other purposes.

In preparing this liquid carbon black dispersion, the three critical ingredients and any other preferred ingredients are thoroughly mixed together to form a stable dispersion. This may be accomplished by subjecting a concentrated form of the liquid carbon black dispersion to ball milling, colloidal milling, high-shear milling, ultrasonic techniques, or by high speed mixing or other standard blending techniques. The thoroughly mixed carbon black dispersion is later diluted with more water while agitating to the desired concentration for the working bath. The preferred methods of mixing are mixing a concentrated form of the dispersion in a high speed mixer or in a ball mill containing glass, mineral, or plastic beads therein for a period of about 1 to about 24 hours. This thorough mixing allows for the carbon black particles to be intimately coated or wetted with the surfactant. This mixed concentrate is then mixed with water or some other liquid dispersing medium to the desired concentration. The carbon black dispersion working bath is preferably kept agitated during both the diluting and contacting steps to aid in keeping the dispersion stable.

As stated above, the carbon black particles should have an average particle diameter below about 3 microns while in the dispersion. It is desirable to have this average particle diameter of carbon black as small as possible to obtain the desired plating characteristics of substantially even plating and no plating pullaways. It is preferred that the carbon black particles have an average particle diameter from about 0.05 to about 3.0 microns, more preferably from 0.08 to about 2.0 microns, when in said dispersion. The term "average particle diameter" as employed herein as to carbon black particles in both the specification and claims refers to average mean diameter of the particles (the average by number). The average mean diameter in the dispersion may be determined through the use of either a NiComp Model 270 submicron particle size analyzer (Version 3.0) or a HIAC PA-720 automatic particle size analyzer (both available from the HIAC/ROYCO Instrument Division of Pacific Scientific of Menlo Park, CA).

All types of carbon blacks may be used for this invention including the commonly available furnace blacks. However, it is preferred to utilize carbon blacks which are initially acidic or neutral, i.e., those which have a pH of between about 1 and about 7.5 and more preferably between about 2 and about 4 when slurried with water. Carbon black particles of the preferred type contain between about 1% and about 10% by weight of volatiles and have an amorphous structure.

These preferred carbon black particles are also very porous and generally their surface areas are from between about 45 to about 1,100, and preferably between about 300 to about 600, square meters per gram as measured by the BET method (method of Brunauer-Emmett-Teller).

Illustrative carbon blacks suitable for use of this invention include Cabot XC-72R Conductive, Cabot Monarch 800, Cabot Monarch 1300, all manufactured by Cabot Corporation of Boston, MA. Other suitable carbon blacks include Columbian T-10189, Columbian Conductex 975 Conductive, Columbian CC-40-220, and Columbian Raven 3500, all available from Columbian Carbon Company of New York, NY. Monarch 800 and Raven 3500 are the two most preferred carbon blacks because of their ease of dispersion and low pH.

The term "liquid dispersing medium" for the liquid carbon black dispersion as used herein in the present specification and claims includes water and polar organic solvents (both protic and aprotic). Suitable protic polar organic solvents may include lower alcohols ($C_1$-$C_4$) such as methanol, ethanol, isopropanol, and isobutanol; polyhydric alcohols such as glycols (i.e. triethylene glycols); ether alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); N-methylpyrrolidone; dimethylsulfoxide (DMSO); and esters of carboxylic acids such as methylformate, ethylacetate, and cellosolve acetate. The preferred liquid dispersing medium is water because of cost and ease of use considerations. It is preferred to utilize deionized water which is free of lime, fluorine, iodine, and other impurities normally found in tap water, in order to minimize interference of foreign ions during the subsequent electroplating step.

In addition to the water and carbon black, a third critical ingredient is needed in the dispersion, namely, a surfactant capable of dispersing said carbon black in said liquid dispersing medium (i.e., compatible with said carbon black and liquid dispersing medium). One or more of these is added to the dispersion in order to enhance the wetting ability and stability of the carbon black and permit maximum penetration by the carbon black within the pores and fibers of the nonconducting layer. Suitable wetting agents include anionic, nonionic, and cationic surfactants (or combinations thereof such as amphoteric surfactants). The surfactants should be soluble, stable and preferably nonfoaming in the liquid carbon black dispersion. In general, for a polar continuous phase as in water, the surfactants should preferably have a high HLB number (8-18). The preferred type of surfactant will depend mainly on the pH of the dispersion. If the total dispersion is alkaline (i.e., has an overall pH in the basic range), it is preferred to employ an anionic or nonionic surfactant. Acceptable anionic surfactants include sodium or potassium salts of naphthalene sulfonic acid such as DARVAN No. 1 (R. T. Vanderbilt Co.), ECCOWET LF (Eastern Color and Chemical), PETRO AA, PETRO ULF (Petro Chemical Co., Inc.), and AEROSOL OT (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid carbon black dispersion is MAPHOS 56. Suitable nonionic surfactants include ethoxylated nonyl phenols such as POLY-TERGENT ® B-Series (Olin Corporation) or alkoxylated linear alcohols such as POLY-TERGENT SL-Series (Olin Corporation).

If the total dispersion is acidic, it is preferred to employ selected anionic surfactants or cationic surfactants. An acceptable group of anionic surfactants would be the sodium or potassium salts of naphthalene sulfonic acid described above. Acceptable cationic surfactants include cetyl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2A1 (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemicals Inc.). Preferred cationic surfactants also include the Duoquad Series such as Duoquad T-50 obtained from Akzo Chemie. Combinations of surfactants may be employed. The term "surfactant", as used herein for making the carbon black dispersion, may include other forms of dispersing agents or aids such as low molecular weight polyelectrolytes and polymers.

The amount of carbon black in the dispersion should be less than about 4% by weight of the dispersion, preferably, less than about 2% by weight. It has been found that the use of higher concentrations of carbon blacks provide undesirable plating characteristics. In the same regard, the solids content (i.e. all of the ingredients other than the liquid dispersing medium) is preferably less than 10% by weight of the dispersion, more preferably, less than about 5.6% by weight.

One additional preferred component of the liquid carbon black-containing dispersion is a strong basic material such as an alkaline hydroxide. Suitable strong basic materials include alkali metal hydroxides such as potassium hydroxide, sodium hydroxide, and lithium hydroxide. Ammonium hydroxide may also be employed, if desired. Potassium hydroxide is the most preferred strong basic material. The term "alkaline hydroxide" is used throughout the description and claims to identify these strong basic materials. Sufficient alkaline hydroxide may be added to the liquid carbon black dispersion in a proportion sufficient to increase the pH of the resulting carbon black-containing dispersion to between about 10 and about 14, and preferably between about 10 and about 12.

Following is a typical formulation of a suitable aqueous alkaline dispersion of carbon black showing the general range of proportions as well as the preferred range of proportions for the various components:

| Component | General Range | Preferred Range |
| --- | --- | --- |
| Carbon Black | 0.1-4% by wt. | 0.15-2% by wt. |
| Surfactant | 0.01-4% | 0.05-2% |
| Alkaline Hydroxide | 0-1% | 0.4-0.8% |
| Water | Balance | Balance |

The liquid dispersion of carbon black is typically placed in a suitably agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the conditioned printed wiring board is immersed therein. The period of immersion generally ranges from about 1 to 10, and preferably from about 3 to 5 minutes. During immersion, the liquid carbon black-containing dispersion penetrates the holes of the printed wiring board and wets and contacts the glass fiber as well as the epoxy resin which forms the components of the insulating layer. The immersed board is then removed from the liquid carbon black-containing dispersion bath.

The carbon black-covered board is then subjected to a step where substantially all (i.e., more than about 95% by weight) of the water in the applied dispersion is removed and a dried deposit containing carbon black is left in the holes and on other exposed surfaces of the nonconducting layer. This may be accomplished by several methods such as by evaporation at room temperature, by a vacuum, by heating the board for a short time at an elevated temperature, or by an air knife, or by other equivalent means. Heating at an elevated temperature is the preferred method. Heating is generally carried out for between about 30 seconds and 45 minutes at a temperature of from about 75° to 120° C., more preferably from about 80° to 98° C. To insure complete coverage of the hole walls, the procedure of immersing the board in the liquid carbon black dispersion and then drying may be repeated one or more times.

The carbon black covered board is now subjected to the additional graphite treatment yielding the deposition of a graphite layer on top of the carbon layer. Preferably, the carbon black-coated PWB board is first optionally contacted with a conditioner solution. The preferred method of contacting with a conditioner is dipping the coated PWB into a room temperature aqueous conditioner bath for about 1-10 minutes. This conditioner bath is used to promote subsequent adsorption of the dispersed graphite particles on the carbon black layer. The preferred conditioners for this step are the same ones as used before the contacting with the carbon black dispersion.

After the application of this optional second conditioner solution, the PWB is subsequently rinsed with water to remove excess conditioner from the board.

The board is next contacted with a liquid graphite dispersion or suspension. This graphite dispersion contains three critical ingredients; namely, graphite, one or more surfactants capable of dispersing the graphite, and a liquid dispersing medium such as water. The preferred methods of contacting the graphite dispersion to include immersion, spraying, or other methods of contacting chemicals used in the PWB industry. A single working bath is sufficient for contacting this graphite dispersion; however, more than one bath may be used for rework or other purpose.

In preparing this liquid graphite dispersion, the three critical ingredients and any other preferred ingredients are thoroughly mixed together. The working graphite dispersion bath is preferably kept agitated during PWB processing to aid in keeping the solids dispersed in the bath. The mixing may be accomplished by subjecting a concentrated form of the liquid graphite dispersion to ball milling, colloidal milling, highshear milling, ultrasonic techniques, by a attritor, or by high speed mixing or other standard blending techniques. The thoroughly mixed graphite dispersion is later diluted with more water while agitating to the desired concentration for the graphite dispersion working bath. The preferred methods of mixing are mixing in a attritor or high speed mixer or in a ball mill containing glass, mineral, or plastic beads therein for a period of about 1 to about 24 hours. This through mixing allows for the graphite particles to be intimately coated or wetted with the surfactant. This mixed concentrate is then mixed with water or some other liquid dispersing medium to the desired concentration. The graphite dispersion bath is preferably kept agitated during both the diluting and contacting steps to aid in keeping the solids dispersed.

As stated above, the graphite particles should have an average particle diameter below about 1.5 microns while in the dispersion. It is desirable to have this average particle diameter of graphite as small as possible to obtain the desired plating characteristics of substantially even plating and no plating pullaways. Preferably, the average particle diameter of the conductive graphite particles are in the range of about 0.05 to about 0.8 microns. More preferably, the average particle diameter is from about 0.1 to about 0.4 microns. It is also required that the graphite particles retain their crystal structure and, therefore, their conductivity. Thus, if the graphite particles are too large, caution in grinding must be exercised since it is known that grinding can be associated with a loss in conductivity. Therefore, the term "conductive graphite particles" as used in the present specification and claims means graphite particles which have a substantially crystalline structure and are essentially free of crystal defects, thus possessing sufficient conductivity to increase the conductivity of the combined carbon black and graphite deposit.

The term "average particle diameter" as employed herein as to graphite particles in both the specification and claims refers to average mean diameter of the graphite particles (the average by number). The average mean diameter in the dispersion may be determined through the use of either a NiComp Model 270 submicron particle size analyzer (Version 3.0) or a HIAC PA-720 automatic particle size analyzer (both available from the HIAC/ROYCO Instrument Division of Pacific Scientific of Menlo Park, CA).

Illustrative conductive graphite particles meeting the critical particle size limitation include Showa Denko Ultrafine Graphite, manufactured by Showa Denko K.K. of Tokyo, Japan; Nippon AUP (0.7 micron), manufactured by Nippon Graphite Industries, Ltd. of Ishiyama, Japan; and Asbury Graphite Micro-850, manufactured by Asbury Graphite Mills of Asbury, NJ.

The term "liquid dispersion medium" for the liquid graphite dispersion as used herein in the present specification and claims includes water and polar organic solvents (both protic and aprotic). Suitable protic polar organic solvents may include lower alcohols ($C_1$-$C_4$) such as methanol, ethanol, isopropanol and isobutanol; polyhydric alcohols such as glycols (i.e. triethylene glycols); ether alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); N-methylpyrrolidone; dimethylsulfoxide (DMSO); and esters of carboxylic acids such as methylformate, ethylacetate, and cellosolve acetate. The preferred liquid dispersing medium for this step is water because of cost and ease of use considerations. It is preferred to utilize deionized water which is free of lime, fluorine, iodine and other impurities normally found in tap water, in order to minimize interference of foreign ions during the subsequent electroplating step.

In addition to the water and graphite, a third critical ingredient is needed in the dispersion, namely, a surfactant capable of dispersing said graphite in said liquid dispersing medium (i.e., compatible with said graphite and liquid dispersing medium). One or more of these surfactants is added to the dispersion in order to enhance the wetting ability and stability of the graphite dispersion. Suitable wetting agents include anionic, nonionic, and cationic surfactants (or combinations thereof such as amphoteric surfactants). The surfactants should be soluble, stable, and preferably nonfoaming in the liquid graphite dispersion. In general, for a polar continuous phase as in water, the surfactants should preferably have a high HLB number (8-18). The preferred type of surfactant will depend mainly on the pH of the dispersion. If the total dispersion is alkaline (i.e., has an overall pH in the basic range), it is preferred to employ an anionic or nonionic surfactant. Acceptable anionic surfactants include sodium or potassium salts of naphthalene sulfonic acid such as DARVAN No. 1 (R. T. Vanderbilt Co.), ECCOWET LF (Eastern Color and Chemical), PETRO AA, PETRO ULF (Petro Chemical Co., Inc.), and AEROSOL OT (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid graphite dispersion is MAPHOS 56. Suitable nonionic surfactants include ethoxylated nonyl phenols such as POLY-TERGENT ® B-Series (Olin Corporation) or alkoxylated linear alcohols such as POLY-TERGENT SL-Series (Olin Corporation).

Acceptable cationic surfactants include cetyl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2A1 (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemicals Inc.). Preferred cationic surfactants also include the Duoquad Series such as Duoquad T-50 obtained from Akzo Chemie. Combinations of surfactants may be employed. The term "surfactant", as used herein for making the graphite dispersion, may include other forms of dispersing agents or aids such as low molecular weight polyelectrolytes and polymers.

The amount of graphite in the dispersion should be less than about 4% by weight of the dispersion, preferably, less than about 2% by weight. It is believed that the use of higher concentrations of graphite provide undesirable plating characteristics. In the same regard, the solids content (i.e., all of the ingredients other than the liquid dispersing medium) is preferably less than 10% by weight of the dispersion, more preferably, less than about 6% by weight.

One additional preferred component of the liquid graphite-containing dispersion is a strong basic material such as an alkaline hydroxide. Suitable strong basic materials include alkali metal hydroxides such as potassium hydroxide, sodium hydroxide, and lithium hydroxide. Ammonium hydroxide may also be employed, if desired. Potassium hydroxide is the most preferred strong basic material. The term "alkaline hydroxide" is used throughout the description and claims to identify these strong basic materials. Sufficient alkaline hydroxide may be added to the liquid carbon black dispersion in a proportion sufficient to increase the pH of the resulting graphite-containing dispersion to between about 10 and about 14, and preferably between about 10 and about 12.

Following is a typical formulation of a suitable aqueous alkaline graphite dispersion showing the general range of proportions as well as the preferred range of proportions for the various components:

| Component | General Range | Preferred Range |
| --- | --- | --- |
| Graphite | 0.1–4% by wt. | 0.15–2% by wt. |
| Surfactant | 0.01–4% | 0.05–2% |
| Alkaline Hydroxide | 0–1% | 0.4–0.8% |
| Water | Balance | Balance |

The liquid graphite dispersion is typically placed in a suitably agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the conditioned printed wiring board is immersed therein. The period of immersion generally ranges from about 1 to 10, and preferably from about 3 to 5 minutes. During immersion, the liquid graphite-containing dispersion coats the carbon black layer which was previously applied. The immersed board is then removed from the liquid graphite dispersion bath.

The board is then subjected to a step where substantially all (i.e., more than about 95% by weight) of the water in the applied dispersion is removed and a dried graphite deposit is left in the holes over the carbon black deposit and on other exposed surfaces of the nonconducting layer. This may be accomplished by several methods such as by evaporation at room temperature, by a vacuum, by heating the board for a short time at an elevated temperature, or by an air knife, or by other equivalent means. Heating at an elevated temperature is the preferred method. Heating is generally carried out for between about 30 seconds and 45 minutes at a temperature of from about 75° to 120° C., more preferably from about 80° to 98° C. To ensure sufficient coverage of the hole walls, the procedure of immersing the board in the liquid graphite dispersion and then drying may be repeated one or more times.

The board is now completely coated with the carbon black and the graphite dispersions. These dispersions are not only coated on the drilled hole surfaces, which is desirable, but also entirely coat the copper plate or foil surfaces which is undesirable. Thus prior to many subsequent operations all carbon black and graphite must be removed from the copper plate or foil surfaces.

The further removal of excessive graphite and/or carbon black specifically from the outer copper surfaces including, especially, the rims of the drilled holes while leaving the coating intact on the glass fibers and epoxy surface of the hole walls, may be achieved by the employment of a microetch bath. Generally, this treatment is carried out at a temperature of about 20° to 30° C. for 35 seconds to about 3 minutes. One suitable sodium persulfate-based microetch is "BLACKHOLE MICROCLEAN I" available from Olin Hunt Specialty Products, Inc. This product is preferably combined with sufficient sulfuric acid to make a microetch bath containing 100–300 grams of sodium persulfate per liter of deionized water and about 1 to 10% by weight sulfuric acid. The mechanism by which this microetch works is by not attacking the carbon black material or the graphite material deposited on the copper foil directly, but rather to attack exclusively the first few atomic layers of copper directly below which provides the adhesion for the coating. Hence, the fully coated board is immersed in the microetch solution to "flake" off the carbon black and the graphite from the copper surfaces in the form of micro-flakelets. These micro-flakelets are removed from the microetch bath either by filtration through a pump or via a weir type filter arrangement commonly used in the PWB industry. The liquid carbon black dispersion, the liquid graphite dispersion, the microetch treatment, and the intermittent water rinses are preferably carried out by immersing the PWB in baths constructed of polypropylene or polyvinyl chloride (PVC) and kept agitated by a recirculation pump or pumped in air.

After the microetch step and a subsequent water rinse, the PWB may now either proceed to the photoimaging process and later be electroplated or be directly panel electroplated. It may be preferred to further clean the PWB with a citric acid anti-tarnish solution or any other acid cleaner solution or both after the above microetch step.

The thus treated printed wiring board is then ready for electroplating operation which includes immersing the PWB in a suitable electroplating bath for applying a copper coating on the hole walls of the nonconducting layer.

The present invention contemplates the use of any and all electroplating operations conventionally employed in applying a metal layer to the through hole walls of a PWB. Therefore, this claimed invention should not be limited to any particular electroplating bath parameters.

A typical copper electroplating bath is comprised of the following components in the following proportions:

| Component | General Proportions | Preferred Proportions |
|---|---|---|
| Copper (as metal) | 2-3 oz/gal | 2.25-2.75 oz/gal |
| Copper Sulfate | 5-10 oz/gal | 6-9 oz/gal |
| 98% Concentrated H$_2$SO$_4$ (by weight) | 23-32 oz/gal | 27-30 oz/gal |
| Chloride Ion | 20-100 mg/l | 40-60 mg/l |

The electroplating bath is normally agitated and preferably maintained at a temperature of between about 20° and 25° C. The electroplating bath is provided with anodes, generally constructed of copper, and the printed wiring board to be plated is connected as a cathode to the electroplating circuit. For example, a current of about 30 amps per square foot is impressed across the electroplating circuit for a period of between about 40 and 60 minutes in order to effect copper plating on the hole walls of the dielectric layer positioned between the two plates of copper up to a thickness of about 1 mil±0.2 mil. This copper plating of the hole wall provides a current path between the copper layers of the printed wiring board. Other suitable electroplating conditions may be employed, if desired. Other electroplating bath compositions containing other copper salts or other metal salts such as salts of nickel, gold, palladium, silver, and the like may be employed, if desired.

The printed wiring board is removed from the copper electroplating bath and then washed and dried to provide a board which is further processed. For example, the PWB may be subjected to a tin-lead electroplating operation.

The following examples are presented to define the invention more fully without any intention of being limited thereby. All parts and percentages are by weight and all temperatures are degrees Celsius unless explicitly stated otherwise.

PRINTED WIRING CIRCUIT BOARD SPECIFICATIONS

Six double-sided control laminated printed wiring boards and eight double-sided test printed wiring boards were treated by the process of this invention. The boards were comprised of two 35 micron thick copper plates secured by pressure fusing to the opposite sides of an epoxy resin/glass fiber layer. These double-sided printed wiring boards were about 15.24 centimeters wide by 22.86 centimeters in length. There were about 500 to 1,000 holes each about 1.0 millimeters in diameter drilled through the copper plates and epoxy resin/glass fiber layer.

EXAMPLE 1

A double-sided printed wiring board described above was prepared for copper electroplating their through holes by first mechanically scrubbing the surfaces of the board. The board was then immersed in the following sequence of aqueous baths for the indicated times:

1. Cleaner (5 mins.).
2. Rinse with tap water (2 mins.).
3. Conditioner (4 mins.).
4. Rinse with tap water (2 mins.)
5. Carbon black preplating dispersion (4 mins.). (Then dry at 93° C. for 20 mins.)
6. Conditioner (4 mins.).
7. Rinse with tap water (2 mins.)
8. Graphite preplating dispersion (4 mins.). (Then dry at 93° C. for 20 mins.)
9. Sodium persulfate microetch (30 secs.).
10. Rinse with tap water (20 secs.).
11. Anti-tarnish solution (20 secs.).
12. Rinse with tap water (20 secs.).

Bath 1 was an aqueous solution containing a cleaner formulation comprised of monoethanolamine, SANDOLEC CF cationic polyelectrolyte, and ethylene glycol in water to remove grease and other impurities from the hole wall surfaces of the board. The bath was heated to about 60° C. to facilitate this cleaning. The cleaner formulation is available as "BLACKHOLE Cleaner 2" from Olin Hunt Specialty Products, Inc. of West Paterson, NJ.

Bath 3 was a room temperature aqueous alkaline bath which contains monoethanolamine and SANDOLEC CF polyelectrolyte and has a pH of about 10 to condition the hole wall surfaces of the board. The conditioner formulation is available as "BLACKHOLE Conditioner" from Olin Hunt Specialty Products, Inc.

Bath 5 was a room temperature deionized water bath containing the carbon black preplating formulation. In this bath, the proportions of each ingredient were as follows:

| | |
|---|---|
| 0.38% | by weight anionic surfactant (1) |
| 0.6% | by weight KOH (2) |
| 0.38% | by weight carbon black (3) |
| 1.24% | by weight solids |

(1) MAPHOS 56—An anionic surfactant produced by Mazer Chemical Inc. of Gurnee, IL (90% by weight surfactant and 10% by weight H$_2$O).
(2) Solid potassium hydroxide pellets (86% by weight KOH, 14% by weight H$_2$O).
(3) RAVEN 3500 carbon black produced by Cabot Corp.

The balance of the bath was deionized water. This carbon black dispersion of bath 5 was prepared by high speed mixing a concentrated form of this dispersion in a high speed mixer. The surfactant was dissolved in deionized water/KOH to give a continuous phase. Then the carbon black was added. Mixing time was 6 hours. After mixing the concentrate was diluted with sufficient deionized water to make the dispersion in the above indicated proportions.

After bath 5, the boards were placed in a hot air recirculatory oven and heated to 93° C. for 20 mins. This drying step removed the water from the carbon black coating on the board, thereby leaving a dried deposit of carbon black all over the board and in the through holes of the board. The drying promotes adhesion between the carbon black and the nonconductive surfaces of the board.

Bath 6 was the same as bath 3.

Bath 8 was a room temperature deionized water bath containing the graphite preplating formulation. In this bath, the proportions of each ingredient were as follows:

| | |
|---|---|
| 0.4% | by weight anionic surfactant (1) |
| 0.6% | by weight KOH (2) |
| 0.6% | by weight graphite (4) |

-continued 1.48% by weight solids (1) The anionic surfactant was MAPHOS 56 supplied by Mazer Chemical, Inc. of Gurnee, IL (90% by weight surfactant and 10% by weight water).
(2) Solid potassium hydroxide pellets (86% by weight KOH, 14% by weight H₂O)
(4) The graphite in this example was Showa Denko Ultrafine Graphite manufactured by Showa Denko of Tokyo, Japan.

The balance of the bath was deionized water. This graphite dispersion of bath 8 was prepared by ball milling a concentrated form of this dispersion in a glass jar with stainless steel balls so that the liquid level was above the ¼ inch diameter stainless steel balls which occupied approximately ½ of the volume of the milling jar. The material was milled for 12 hours. After milling, the concentrate was diluted with sufficient deionized water to make the dispersion in the above-indicated proportions. After bath 8, the boards were dried as described for bath 5 above.

Bath 9 was a room temperature aqueous bath and contained 200 g of sodium persulfate per liter of deionized water and 0.5% by volume of concentrated $H_2SO_4$. Its function was to microetch the copper surfaces of the board so as to remove the deposited carbon black from the surfaces. It does not act on the resin/glass surfaces. This sodium persulfate microetch was made from "BLACKHOLE Microclean I" and is available from Olin Hunt Specialty Products, Inc. of West Paterson, NJ.

Bath 11 was a room temperature aqueous bath and contained 50 g of citric acid per liter of deionized water and 0.5% by volume of concentrated $H_2SO_4$. Its function was to prevent the copper surfaces of the printed wiring boards from tarnishing.

Rinse baths 2, 4, 7, 10, and 12 were employed to prevent the carryover of chemicals from one treatment bath into the next.

After treatment in bath 12, the boards were air dried and evaluated by measuring the resistance between the two copper plates. This was done by placing an electrode from a Multimeter on each surface and recording the resistance. The results are tabulated in Table No. 2 below.

After treatment with this sequence of baths, the printed wiring boards were placed in a commercial electroplating bath sequence including a VERSA-CLEAN 400 acid cleaner bath, rinse, microetch step, rinse, acid dip, and electroplating bath. The electroplating bath was provided with agitation means and heating means which contained electrolyte chemistry comprised of the following:

| Plating Bath Composition | |
|---|---|
| Component | Proportion |
| Copper (as metal) | 2.5 oz./gal. |
| Copper Sulfate | 6.2 oz./gal. |
| 98% Concentrated $H_2SO_4$ by weight | 30 oz./gal. |
| Chloride ion | 40 mg/l |

The printed wiring board was connected as a cathode in the electroplating vessel having a volume of about 720 liters. Twelve copper bars were immersed in the electrolyte and connected to the cell circuits as anodes. The copper bars had a length of about 91 cm; a width of about 9 cm and a thickness of about 4 cm. Each face was about 819 square cm.

A direct current of 20 amps per square foot was impressed across the electrodes in the electroplating bath for 1 min. The bath was maintained at 25° C. during this period, and agitation was effected by air sparging. At the end of this period, the board was disconnected from the electroplating circuit, removed from the electrolyte, washed with tap water, and dried.

An examination of the through holes of the resulting electroplated printed wiring boards was conducted and the completeness of copper coverage was noted. (See Table No. 1 below for comparison to standards.) Evaluation of the copper coverage, after 1 minute of plating, was carried out by cross-sectioning and backlight methods.

EXAMPLE 2

A double-sided board described above was treated exactly as in Example 1, except that it was electroplated for approximately 55 mins. in order to build up a thickness of copper of approximately 0.001 inches on the hole wall surface. The holes were examined visually comparing them to standards described below. The board was then evaluated for adhesion by subjecting it to a standard solder shock test. The graphite treated holes showed excellent uniformity of the electroplated layer and excellent adhesion to the hole walls.

COMPARISONS 1A and 1B

Two of the double-sided boards described above were treated exactly as in Examples 1 and 2 except that steps 6, 7, and 8 were omitted. One (C-1A) of the boards was electroplated for 1 min.; the second one (C-1B) for approximately 55 mins. This process is referred to as single-pass carbon black. The board C-1B was evaluated for adhesion by subjecting it to a standard solder shock test. The results are shown in Table 3.

COMPARISONS 2A and 2B

Two double-sided boards described above were treated exactly as in Examples 1 and 2 except that step 8 (the graphite dispersion) was replaced by repeating step 5. One of the boards (C-2A) was electroplated for 1 minute and the other board (C-2B) was electroplated for approximately 55 mins. This process is referred to as double-pass carbon black. The board C-2B was evaluated for adhesion by subjecting it to a standard solder shock test. The results of that test are shown in Table 3.

COMPARISONS 3A and 3B

Two double-sided boards described above were treated exactly as in Examples 1 and 2 except that steps 5, 6, and 7 were omitted. One of the boards (C-3A) was electroplated for 1 min. and the other (C-3B) was electroplated for approximately 55 mins. This process is referred to as single-pass graphite. This board (C-3B) was not evaluated for adhesion since significant voids were observed even after 55 mins. of plating.

EXAMPLE 3

A double-sided board described above was treated exactly as in Example 1 except that step 8 was replaced in its entirety by an aqueous dispersion comprised of:

0.4% by weight anionic surfactant (1)
0.6% by weight KOH (2)
0.4% by weight graphite (5)

-continued 1.28% by weight solids (1) The anionic surfactant was MAPHOS 56, as described above.
(2) KOH solid pellets as described above.
(5) The graphite in this example was Nippon AUP (0.7 micron) supplied by Nippon Graphite Industries, Ltd. of Ishiyama, Japan.

The balance of the bath was deionized water. The graphite dispersion was prepared by grinding a concentrated form of this dispersion in a laboratory attritor (Model 0-1 made by Union Process of Akron, OH) so that the liquid level was just above the ⅛ inch diameter stainless steel balls which occupied approximately one half of the volume of the chamber. The material was ground for 12 hours at 70% full power. After grinding, the concentrate was diluted with sufficient deionized water to make the dispersions in the above indicated proportions.

EXAMPLE 4

A double-sided board described was treated exactly as in Example 2 except that Nippon AUP 0.7 micron graphite dispersion, prepared as described in Example 3 above, replaced the Showa Denko graphite dispersion in step 8.

EXAMPLE 5

A double-side board described above was treated exactly as in Example 3 except that Asbury Graphite Micro-850 supplied by Asbury Graphite Mills, Asbury, NJ, replaced the Nippon AUP (0.7 micron) graphite in the dispersion described in step 8.

EXAMPLE 6

A double-sided board described above was treated exactly as in Example 4 except that Asbury Graphite Micro-850 replaced Nippon AUP (0.7 micron) graphite in the dispersion described in step 8.

TABLE 1

COOPER COVERAGE OF THROUGH HOLE AFTER ELECTROPLATING FOR 1 MIN. AT 20 AMPS/SQ. FT

| Board | Process or Graphite Used | Coverage After 1 Min. |
|---|---|---|
| Example 1 | Showa Denko | 100% |
| Comparative Example 1A | Single-pass carbon black | Less than 10% |
| Comparative Example 2A | Double-pass carbon black | Less than 50% |
| Comparative Example 3A | Single-pass graphite | Less than 50% |
| Example 3 | Nippon AUP 0.7 micron | 100% |
| Example 5 | Asbury Micro-850 | 100% |

TABLE 2

RESISTANCE BETWEEN COPPER PLATES FOR TREATED (BUT NOT ELECTROPLATED) BOARDS

| Board | Process or Graphite Used | Resistance (Ohms) |
|---|---|---|
| Example 1 | Showa Denko | 15-35 |
| Comparative Example 1A | Single-pass carbon black | 200-250 |
| Comparative Example 2A | Double-pass carbon black | 40-50 |

TABLE 3

THROUGH HOLE COPPER COVERAGE & ADHESION (SOLDER SHOCK) FOR FULLY-ELECTROPLATED (55 MINS. AT 20 AMPS/SQ. FT.) BOARDS. BOTH MEASUREMENTS ARE RATED AS COMPARABLE TO THE STANDARD 2B.

| Board | Process or Graphite Used | Coverage | Adhesion |
|---|---|---|---|
| Example 2 | Showa Denko | Comparable | Comparable |
| Comp. Example 1B | Single-pass carbon black | Comparable | Comparable |
| Comp. Example 2B | Double-pass carbon black | Acceptable | Acceptable |
| Comp. Example 3B | Single-pass graphite | Some voids | Not done |
| Example 4 | Nippon AUP 0.7 micron | Comparable | Comparable |
| Example 6 | Asbury 850 | Comparable | Comparable |

Coverage results mean that the cross-sectioned boards were evaluated as to voids and uniformity of thickness. The Examples of present invention (E-2, E-4, and E-6) were all comparable to standard double-pass carbon black process. The adhesion results also show that they were comparable to standard double-pass carbon black process.

Accordingly, these results together show that boards tested according to Examples 1, 3, and 5 exhibit faster plating characteristics than all of Comparison process, while retaining the excellent coverage and adhesion characteristics of those processes.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A process for electroplating a conductive metal layer to the surface of a nonconductive material, comprising the following steps:
   (a) contacting said nonconductive surface with a liquid carbon black dispersion comprising:
      (1) carbon black particles having an average particle diameter of less than about 3.0 microns in said dispersion;
      (2) an effective dispersing amount of a surfactant which is compatible with said carbon black; and
      (3) a first liquid dispersing medium, wherein the amount of carbon black is sufficient to coat substantially all of said nonconducting surfaces and is less than about 4% by weight of said liquid carbon black dispersion;
   (b) separating substantially all of said first liquid dispersing medium from said carbon black particles, whereby said particles are deposited on said nonconductive surface in a substantially continuous layer; and
   (c) contacting said carbon black-coated nonconductive surface with a liquid conductive graphite dispersion comprising:
      (1) conductive graphite particles having an average particle diameter of less than about 1.5 microns in said dispersion;

(2) an effective dispersing amount of a surfactant which is compatible with said conductive graphite; and (3) a second liquid dispersing medium, wherein the amount of conductive graphite is less than about 4% by weight of said liquid conductive graphite dispersion;

(d) separating substantially all of said second liquid dispersing medium from said conductive graphite particles, whereby said particles are deposited on said carbon black-coated nonconductive surface; and (e) electroplating a substantially continuous conductive metal layer over the deposited carbon black layer and the deposited conductive graphite layer and said nonconductive surface.

2. The process of claim 1 wherein said carbon black particles have an average diameter of from about 0.05 to about 3.0 microns.

3. The process of claim 2 wherein said carbon black particles have an average diameter of from about 0.08 to about 2.0 microns.

4. The process of claim 1 wherein said graphite particles have an average particle diameter of from about 0.05 to about 0.8 microns.

5. The process of claim 1 wherein both said first and second liquid dispersing mediums are water.

6. The process of claim 1 wherein said liquid carbon black dispersion contains less than about 10% by weight solids constituents.

7. The process of claim 1 wherein said liquid graphite dispersion contains less than about 10% by weight solids constituents.

8. The process of claim 1 wherein said contacting steps (a) and (c) are carried out by immersing the nonconductive material into said liquid carbon black dispersion and liquid conductive graphite dispersion, respectively.

9. The process of claim 1 wherein said separating steps (b) and (d) are carried out by heating the deposited dispersions.

10. The process for electroplating the walls of through holes in a laminated printed wiring board comprised of at least one nonconducting layer laminated to at least two separate conductive metal layers, said process comprising the steps:

(a) contacting said printed wiring board having said through holes in a bath of a liquid carbon black dispersion comprised of:
 (1) carbon black particles having an average particle diameter of less than about 3.0 microns in said dispersion;
 (2) an effective dispersing amount of a surfactant which is compatible with said carbon black; and
 (3) a first liquid dispersing medium wherein the amount of carbon black is sufficient to coat substantially all of said nonconducting surfaces and is less than about 4% by weight of said liquid carbon black dispersion;

(b) separating substantially all of the liquid dispersing medium from said dispersion, thereby depositing said carbon black particles in a substantially continuous layer on said nonconducting portions of said hole walls; and (c) contacting said carbon black-coated printed wiring board with a liquid conductive graphite dispersion comprising:
 (1) conductive graphite particles having an average particle diameter of less than about 1.5 microns in said dispersion;
 (2) an effective dispersing amount of a surfactant which is compatible with said conductive graphite; and
 (3) a second liquid dispersing medium, wherein the amount of conductive graphite is less than about 4% by weight of said liquid conductive graphite dispersion;

(d) separating substantially all of said second liquid dispersing medium from said conductive graphite particles, whereby said particles are deposited on said printed wiring board;

(e) microetching said metal layers of said printed wiring board to remove any deposited carbon black and graphite therefrom; and (f) electroplating a substantially continuous conductive metal layer over the deposited carbon black layer and the deposited conductive graphite layer on said nonconductive portions of said hole walls, thereby electrically connecting said metal layers of said printed wiring board.

11. The process of claim 10 wherein said first and second liquid dispersions further comprise a sufficient amount of at least one alkaline hydroxide to raise the pH of said liquid dispersions in the range from about 10 to 14.

12. The process of claim 11 wherein said alkaline hydroxide is selected from the group consisting of potassium hydroxide, sodium hydroxide, and ammonium hydroxide.

13. The process of claim 10 wherein said first and second liquid dispersions contain less than about 10% by weight solids constituents.

14. The process of claim 10 wherein said carbon black particles have an initial pH from about 2 to about 4.

15. The process of claim 10 wherein said surfactant is a phosphate ester anionic surfactant.

16. The process of claim 10 wherein said conductive metal is copper.

17. The process of claim 10 wherein said first and second liquid dispersing medium is water.

18. The process of claim 10 wherein said process further comprises, before step (a), contacting said printed wiring board with a cleaning solution and a conditioner solution.

19. The process of claim 18 wherein said process further comprises a water rinse after said microetching step (e).

20. A nonconductive surface covered with a deposit of a substantially continuous layer of carbon black having an average particle diameter of less than about 3.0 microns thereon and a layer of conductive graphite having an average particle diameter of less than about 1.5 microns deposited over said carbon black deposit.

21. The nonconductive surface of claim 20 wherein said nonconductive surface comprises at least one through hole of a printed wiring board.

22. A metal-plated nonconductive surface covered with a deposit of a substantially continuous layer of carbon black having an average particle diameter of less than about 3.0 microns thereon and a layer of conductive graphite having an average particle diameter of less than about 1.5 microns deposited over said carbon black deposit and underlying the plated on metal.

23. The metal-plated nonconductive surface of claim 22 wherein said nonconductive surface comprises at least one through hole of a printed wiring board.

24. The metal-plated nonconductive surface of claim 22 wherein said metal is copper.

25. A liquid dispersion suitable for use in enhancing the electroplating of a nonconducting surface comprised of:
(a) conductive graphite particles having an average particle diameter of less than about 1.5 microns in said dispersion;
(b) an effective dispersing amount of a surfactant which is compatible with said conductive graphite;
(c) optionally, a sufficient amount of at least one alkaline hydroxide to raise the pH of said liquid dispersion in the range from about 9 to 14; and
(d) liquid dispersing medium, wherein the amount of conductive graphite is sufficient to coat substantially all of said nonconducting surface and is less than about 4% by weight of said liquid dispersion and wherein said liquid dispersion contains less than about 10% by weight solids constituents.

26. The dispersion of claim 25 wherein said alkaline hydroxide is selected from the group consisting of potassium hydroxide, sodium hydroxide, and ammonium hydroxide.

27. The dispersion of claim 25 wherein said surfactant is a phosphate ester anionic surfactant.

28. The dispersion of claim 25 wherein said liquid dispersion medium is water.

29. The dispersion of claim 25 wherein said dispersion further comprises an alkaline hydroxide and said liquid dispersing medium is water, wherein the percentages of each component of said dispersion is as follows:
conductive graphite having an average particle diameter about 0.05–0.8 microns: 0.1–4% by weight
surfactant: 0.01–4% by weight
alkaline hydroxide: 0–1% by weight
water: Balance.

30. The dispersion of claim 29 wherein said dispersion consists essentially of:
conductive graphite having an average particle diameter of about 0.1–0.4 microns: 0.2–2% by weight
phosphate ester anionic surfactant: 0.05–2% by weight
potassium hydroxide: 0.4–0.8% by weight
water: Balance.

* * * * *